US007138335B2

(12) United States Patent
Toyoda et al.

(10) Patent No.: US 7,138,335 B2
(45) Date of Patent: Nov. 21, 2006

(54) METHOD OF FORMING ELECTRODE FOR FLAT DISPLAY PANEL

(75) Inventors: Osamu Toyoda, Kawasaki (JP); Shinya Fukuta, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 107 days.

(21) Appl. No.: 10/898,335

(22) Filed: Jul. 26, 2004

(65) Prior Publication Data

US 2005/0191783 A1 Sep. 1, 2005

(30) Foreign Application Priority Data

Feb. 27, 2004 (JP) ............................ 2004-053569

(51) Int. Cl.
*H01L 21/44* (2006.01)
*H01J 9/02* (2006.01)
*H01J 9/04* (2006.01)
*H01J 9/12* (2006.01)
*H01J 9/14* (2006.01)

(52) U.S. Cl. .......................... 438/678; 445/35; 445/46; 257/E21.476

(58) Field of Classification Search ................ 438/678; 445/46

See application file for complete search history.

(56) References Cited

U.S. PATENT DOCUMENTS 4,349,583 A * 9/1982 Kulynych et al. .......... 427/581
5,660,883 A * 8/1997 Omura ....................... 427/304
5,992,320 A * 11/1999 Kosaka et al. ........... 101/401.1
6,207,268 B1 * 3/2001 Kosaka et al. .............. 428/325
6,207,369 B1 * 3/2001 Wohlstadter et al. .......... 435/6
6,627,544 B1 * 9/2003 Izumi et al. ................ 438/678
6,805,601 B1 * 10/2004 Aoki et al. ................... 445/24

FOREIGN PATENT DOCUMENTS

JP 2001-043793 2/2001

* cited by examiner

*Primary Examiner*—David A. Zarneke
(74) *Attorney, Agent, or Firm*—Staas & Halsey LLP

(57) ABSTRACT

A reducing agent is discharged by an ink-jet method into a groove between partition walls of a glass substrate formed by sandblasting, that is, a desired region where an electrode is to be formed. After fixing the reducing agent to the glass substrate, the entire substrate is immersed into a plating solution so as to reduce and deposit a plating catalytic metal contained in the plating solution in the region where the reducing agent is fixed. By immersing the entire substrate into an electroless plating solution, a metal is deposited by electroless plating in the region where the plating catalytic metal is deposited. The variation in the shape of electrodes to be formed is reduced, and mass production and low cost are achieved.

6 Claims, 5 Drawing Sheets

METHOD OF FORMING ELECTRODE FOR FLAT DISPLAY PANEL

CROSS-REFERENCE TO RELATED APPLICATIONS

This non-provisional application claims priority under 35 U.S.C. §119(a) on Patent Application No. 2004-53569 filed in Japan on Feb. 27, 2004, the entire contents of which are hereby incorporated by reference.

BACKGROUND OF THE INVENTION

The present invention relates to a method of forming an electrode for a flat display panel, and more specifically relates to a method of forming an electrode in a space enclosed by partition walls in a plasma display panel (PDP), etc.

FIG. 1 is a perspective view showing essential parts of a general surface discharge AC PDP. A PDP 1 is a self-emission type thin display panel constructed by disposing a front substrate 10 comprising glass having good transmittance in a visible light range (380 nm to 770 nm) as a base and a rear substrate 20 to face each other and sealing a discharge medium such as Xe—Ne and Xe—He in a sealed space created by sealing the peripheral portions of the opposing surfaces of the front substrate 10 and rear substrate 20.

On a surface of the front substrate 10 facing the rear substrate 20, a pair of surface discharge display electrodes 11*a* and 11*b* extending in the first direction, X, are formed at a predetermined pitch, and a dielectric layer 12 for AC drive and a protecting layer 13 made of MgO are formed one upon another to cover the display electrodes 11*a* and 11*b*. In general, each of the display electrodes 11*a* and 11*b* is composed of a transparent electrode 14 such as ITO, and a bus electrode 15 made of a metal electrode material such a thick film of Ag. The bus electrode 15 has the function of decreasing the line resistance as well as the function of supplying a voltage to the transparent electrode 14 from an external circuit mounted outside the panel, and one end of the bus electrode 15 is guided to the peripheral portion of the front substrate 10, i.e., the edge of the front substrate 10 in one direction. The protecting layer 13 performs an important role to prevent ion impact on the dielectric layer 12 and emit secondary electrons for discharge.

On the other hand, a plurality of partition walls 21 extending in the second direction, Y, orthogonal to the first direction, X, are formed at a predetermined pitch on a surface of the rear substrate 20 facing the front substrate 10. Further, address electrodes 22 for address discharge are formed parallel to the partition walls 21 on the bottom face of grooves between the partition walls 21; a dielectric layer 23 is formed to cover the address electrodes 22; and fluorescence layers 24*a*, 24*b* and 24*c* of three colors, R, G and B, for color display are formed on the side faces of the partition walls 21 and the front face of the dielectric layer 23. A space enclosed by adjacent partition walls 21 within the sealed space is a discharge space. Note that the address electrode 22 is made of a metal electrode material such as Cr, Cu, and a thick film of Ag, performs the function of supplying a voltage from the external circuit mounted outside the panel, and is extended to the peripheral portion of the rear substrate 20.

Each region separated by the intersection of the display electrodes 11*a*, 11*b* and address electrodes 22 is the display area of a pixel, and selectively causes an address discharge for display writing by applying a voltage between one of the display electrode 11*a* (or 11*b*) and the address electrode 22, subsequently causes a discharge for maintaining the display in the cell where the address discharge is caused by applying a voltage between a pair of display electrodes 11*a* and 11*b*, and emits vacuum ultraviolet light when electrons collide with Xe in the discharge medium. The vacuum ultraviolet light is excited with visible light by the fluorescent layers 24*a*, 24*b* and 24*c* provided on the rear substrate 20, and the visible light is emitted to the outside.

Next, the following description will explain a general manufacturing method of a PDP which is the mainstream nowadays, and, here, a manufacturing method of the rear substrate 20 relating to the present invention.

(Electrode Formation Step)

First, after depositing a Cr/Cu/Cr metal thin film on a surface of a glass substrate by sputtering, address electrodes are formed in a desired pattern (for example, a pattern of straight lines) by patterning the metal thin film by a photolithography technique. It may, of course, be possible to form address electrodes in a desired pattern by depositing a photosensitive metal (for example, a photosensitive Ag paste) and then directly exposing the photosensitive metal.

(Dielectric Layer Formation Step)

Next, a dielectric layer is formed by applying a low-melting-point glass paste such as $PbO—B_2O_3—ZnO$-based glass material to the substrate by screen printing or roll coating and then sintering the applied low-melting-point glass paste at a desired sintering temperature (500 to 600° C.: about 15 minutes).

(Partition Wall Formation Step)

A low-melting-point glass paste to be partition walls is applied to the surface of the substrate by roll coating or other method, and then dried. Consequently, a partition wall material layer made of the low-melting-point glass is formed on the surface of the substrate. Next, a photosensitive resin film such as a dry film resist is attached to the surface of the substrate, and then the attached photosensitive resin film is formed into a mask pattern corresponding to the partition wall shape by a photolithography technique. The formed mask pattern makes an anti-sandblasting mask to be described later. Non-sintered partition walls having the shape of the mask pattern are formed by injecting an abrasive material such as glass beads and calcium carbonate with higher hardness than the partition wall material layer onto the surface of the substrate by sandblasting and cutting the partition wall material layer in regions other than the mask pattern. Then, after separating the photosensitive resin film from the substrate, the non-sintered partition walls are sintered to make glass under desired conditions (temperature: 500 to 600° C., and time: about 15 minutes), thereby completing the partition walls.

In the above-described manufacturing method, the partition wall material layer is necessary to make the partition walls though most part of the partition wall material layer is cut off by sandblasting, and therefore an increase in the cost is unavoidable. Moreover, since the partition wall material is cut by sandblasting before sintering, there is a possibility that foreign matter such as broken pieces of the partition walls may be produced during the partition wall formation step, and the produced foreign matter causes the problem of lower manufacturing yield.

Hence, in recent years, research has been conducted actively on a method of forming partition walls by direct carving of glass in which the partition walls are formed by directly cutting the glass substrate itself by sandblasting (for example, Japanese Patent Application Laid-Open No. 2001-43793). The following description explains a general method for forming partition walls by direct carving of glass that is currently under research.

(Partition Wall Formation Step)

First, a photosensitive resin film such as a dry film resist having resistance to sandblasting is attached to a surface of a glass substrate, and then the attached photosensitive resin film is formed into a desired mask pattern by a photolithography technique. The glass substrate in regions other than the mask pattern is cut off (depth of cutting: about 150 to 200 μm) by injecting an abrasive (particle diameter of about 10 to 20 μm) such as alumina and SiC with higher hardness than the glass substrate onto the surface of the glass substrate by sandblasting.

(Electrode Formation Step)

Next, after separating the photosensitive resin film from the substrate, a Cr/Cu/Cr metal thin film is deposited on the substrate surface by sputtering, and then a resist is applied to the surface of the substrate and dried. Thereafter, the resist in regions other than a region that is intended to be left as an electrode pattern is exposed and developed. An electrode having the electrode pattern is formed by removing an unnecessary metal thin film by etching.

(Dielectric Layer Formation Step)

Next, a dielectric layer is formed by applying a low-melting-point glass paste such as PbO—$B_2O_3$—ZnO-based glass material between the partition walls of the substrate by screen printing or other method and sintering the applied low-melting-point glass paste under desired sintering conditions (temperature: 500 to 600° C., and time: about 15 minutes).

In the above-described method of forming partition walls by direct carving of glass, since the partition walls are formed by directly cutting the glass substrate itself by sandblasting, there is no need to form the partition wall material layer, and thus it is possible to reduce the cost from the point of view of the material and processing step. Moreover, since the partition walls are formed by only processing the glass substrate, even when foreign matter such as broken pieces of the partition walls are produced, the number of choices for washing methods is increased because there is no possibility that the substrate is badly affected even if jet washing or ultrasonic washing, for example, is performed, and consequently the produced foreign matter can be easily removed. In other words, the method of removing foreign matter after the formation of the electrode and dielectric layer may have bad effects on the electrode and dielectric layer, whereas in the method of forming partition walls by direct carving of glass, since the removal of foreign matter is performed before the formation of the electrode and dielectric layer, there is no such bad effects.

However, during the formation of the electrode by the method of forming partition walls by direct carving of glass, since the partition walls have been formed when applying a resist to the substrate, there is a problem that air bubbles tend to be generated in the resist because the partition walls function as projections. Moreover, since the cross sectional configuration of the substrate is not uniform, the surface tension applied to the resist is not uniform, and the resist tends to gather in a region with a small radius of curvature (bent portion). As a result, the film thickness of the resist in the bent portion becomes thicker, while the film thickness of the resist in a region with a large radius of curvature becomes thinner, resulting in a problem of non-uniform film thickness of the resist. Thus, the etching shape, namely, electrode shape, varies when etching the metal thin film, and in the worst case, the electrode is disconnected, which causes the problem of lower manufacturing yield.

In addition, there is a proposed method in which, after forming partition walls by cutting a glass substrate, a conductive material is directly formed on a desired position by an ink-jet method. In this method, however, in order to ensure a film thickness required for the electrode, it is necessary to repeatedly draw the conductive material, and consequently the time required for electrode formation (tact time) becomes very long. Moreover, in order to form the shape and reduce the resistance, it is necessary to draw a large amount of electrode material, and consequently the cost is increased.

BRIEF SUMMARY OF THE INVENTION

The present invention has been made with the aim of solving the above problems, and it is an object of the present invention to provide a method of forming an electrode for a flat display panel, capable of achieving mass production and low cost and reducing the variation in the shape of electrodes by fixing a reducing agent for reducing and depositing a plating catalytic metal between partition walls of a flat display panel substrate having a plurality of partition walls on a surface thereof, reducing and depositing the plating catalytic metal on the fixed reducing agent, and depositing a metal by electroless plating between the partition walls of the substrate on which the plating catalytic metal is deposited so as to form a metal electrode.

Another object of the invention is to provide a method of forming an electrode for a flat display panel, capable of achieving mass production and low cost and reducing the variation in the shape of electrodes by directly forming a plating catalytic metal between partition walls of a flat display panel substrate having a plurality of partition walls on a surface thereof and depositing a metal by electroless plating between the partition walls of the substrate on which the plating catalytic metal is formed so as to form a metal electrode.

Still another object of the invention is to provide a method of forming an electrode for a flat display panel, capable of reducing the resistance of an electrode and obtaining superior conductive characteristics by further depositing, on the surface of the deposited metal, a metal of the same kind as or different kind from the metal by electroplating by supplying a current to the metal deposited between partition walls of the substrate.

A method of forming an electrode for a flat display panel according to a first aspect of the invention is an electrode formation method for a flat display panel for forming a metal electrode between partition walls of a flat display panel substrate having a plurality of partition walls on a surface thereof, and comprises the steps of discharging a reducing agent for reducing and depositing a plating catalytic metal between the partition walls of the substrate and fixing the reducing agent; reducing and depositing the plating catalytic metal between the partition walls of the substrate where the reducing agent is fixed; and depositing a metal between the partition walls of the substrate to form a metal electrode by immersing the substrate on which the plating catalytic metal is reduced and deposited into an electroless plating solution.

In the first aspect, after discharging a reducing agent for reducing and depositing a plating catalytic metal between the partition walls of the substrate and fixing the reducing agent, the plating catalytic metal is reduced and deposited between the partition walls of the substrate where the reducing agent is fixed. Then, by immersing the substrate on which the plating catalytic metal is reduced and deposited into an electroless plating solution, a metal is deposited between the partition walls of the substrate and a metal electrode is formed. Thus, the reducing agent just needs to have the function of reducing and depositing the plating catalytic metal and it is sufficient to discharge a very small amount of the reducing agent between the partition walls of the substrate, and consequently the amount of the material can be reduced significantly. Moreover, since the reduction reaction occurs only in a region where the reducing agent is present, the plating catalytic metal is reduced and deposited only between the partition walls, and thus it is possible to reduce the variation in the shape of electrodes. Further, since all electrodes can be deposited and formed at one time by immersing the substrate in an electroless plating solution, it is possible to achieve mass production even with inexpensive facilities and it is also possible to significantly reduce the tact time required for electrode formation. In addition, since a metal is formed by the growth of an electrode material by deposition and makes an electrode, an etching step does not exist in the electrode formation process, and electrode disconnection caused by a conventional photo process will not occur.

According to a method of forming an electrode for a flat display panel of a second aspect of the invention, in the reducing and depositing step of the first aspect, the substrate on which the reducing agent is fixed is immersed into a plating solution containing the plating catalytic metal. In the second aspect, by immersing the substrate on which the reducing agent is fixed into the plating solution, all plating catalytic metals are reduced and deposited at one time. Thus, by controlling the time in which the substrate is immersed in the plating solution, it is possible to uniformly control the deposition amount of all the plating catalytic metals, and it is possible to reduce the variation in the shape of electrodes.

According to a method of forming an electrode for a flat display panel of a third aspect of the invention, in the reducing and depositing step of the first aspect, a plating solution containing the plating catalytic metal is discharged between the partition walls of the substrate where the reducing agent is fixed. In the third aspect, by discharging the plating solution between the partition walls of the substrate where the reducing agent is fixed, the plating catalytic metal is reduced and deposited. Thus, since the plating solution is discharged (drawn) only between the partition walls of the substrate, the amount of the material can be reduced significantly. Moreover, since the reduction reaction occurs only in a region where both the reducing agent and plating solution are present, the plating catalytic metal is reduced and deposited between the partition walls. In other words, since both the reducing agent and plating solution are present only between the partition walls, there is no possibility that the plating catalytic metal is reduced and deposited in regions other than between the partition walls, thereby enabling more accurate patterning.

A method of forming an electrode for a flat display panel according to a fourth aspect of the invention is an electrode formation method for a flat display panel for forming a metal electrode between partition walls of a flat display panel substrate having a plurality of partition walls on a surface thereof, and comprises the steps of: forming a plating catalytic metal between the partition walls of the substrate by discharging a dispersion solution in which plating catalytic metal particles are dispersed; and depositing a metal between the partition walls of the substrate to form a metal electrode by immersing the substrate on which the plating catalytic metal is formed into an electroless plating solution.

In the fourth aspect, after directly forming a plating catalytic metal between the partition walls of the substrate by discharging the dispersion solution in which plating catalytic metal particles are dispersed, a metal is deposited between the partition walls of the substrate to form a metal electrode by immersing the substrate on which the plating catalytic metal is formed into an electroless plating solution. Thus, since the above-mentioned step of fixing the reducing agent between the partition walls of the substrate can be omitted, it is not necessary to use the reducing agent, and the tact time required for electrode formation can be reduced significantly.

A method of forming an electrode for a flat display panel according to a fifth aspect of the invention is an electrode formation method for a flat display panel for forming a metal electrode between partition walls of a flat display panel substrate having a plurality of partition walls on a surface thereof, and comprises the steps of: vapor-depositing a plating catalytic metal between the partition walls of the substrate; and depositing a metal between the partition walls of the substrate to form a metal electrode by immersing the substrate on which the plating catalytic metal is vapor-deposited into an electroless plating solution.

In the fifth aspect, after directly forming a plating catalytic metal between the partition walls of the substrate by vapor deposition, a metal is deposited between the partition walls of the substrate to form a metal electrode by immersing the substrate on which the plating catalytic metal is vapor-deposited into an electroless plating solution. Thus, since the above-mentioned step of fixing the reducing agent between the partition walls of the substrate can be omitted, it is not necessary to use the reducing agent, and the tact time required for electrode formation can be reduced significantly. In such a vapor deposition process, if a stencil mask is used, it is possible to form a vapor deposition pattern, and it may also be possible to utilize direct vapor deposition patterning using a nozzle.

A method of forming an electrode for a flat display panel according to a sixth aspect of the invention is based on any one of the first through fifth aspects, and comprises the step of further depositing, on a surface of the metal deposited between the partition walls of the substrate, a metal of the same kind as or different kind from the deposited metal by supplying a current to the metal deposited between the partition walls. In the sixth aspect, by supplying a current to the metal deposited between the partition walls of the substrate, a metal of the same kind as or different kind from the deposited metal is further deposited on the surface of the deposited metal by electroplating. Consequently, the resistance of the electrode is reduced, and superior conductive characteristics are obtained.

According to a method of forming an electrode for a flat display panel of a seventh aspect of the invention, in any one of the first through sixth aspects of the invention, the partition walls are formed by cutting a surface of a glass substrate by sandblasting or etching. In the seventh aspect, since the partition walls are formed on the glass substrate by cutting the surface of the substrate by sandblasting or etching, there is no need to form a partition wall material layer, and thus it is possible to achieve low cost from the point of view of the material and processing step.

The above and further objects and features of the invention will more fully be apparent from the following detailed description with accompanying drawings.

DETAILED DESCRIPTION OF THE INVENTION

The following description will explain in detail the present invention, based on the drawings illustrating some embodiments thereof. Note that the following embodiments explain a mode in which an electrode (address electrode) is formed in a space enclosed by partition walls formed on a rear substrate of a PDP.

(Embodiment 1)

Figure 1:
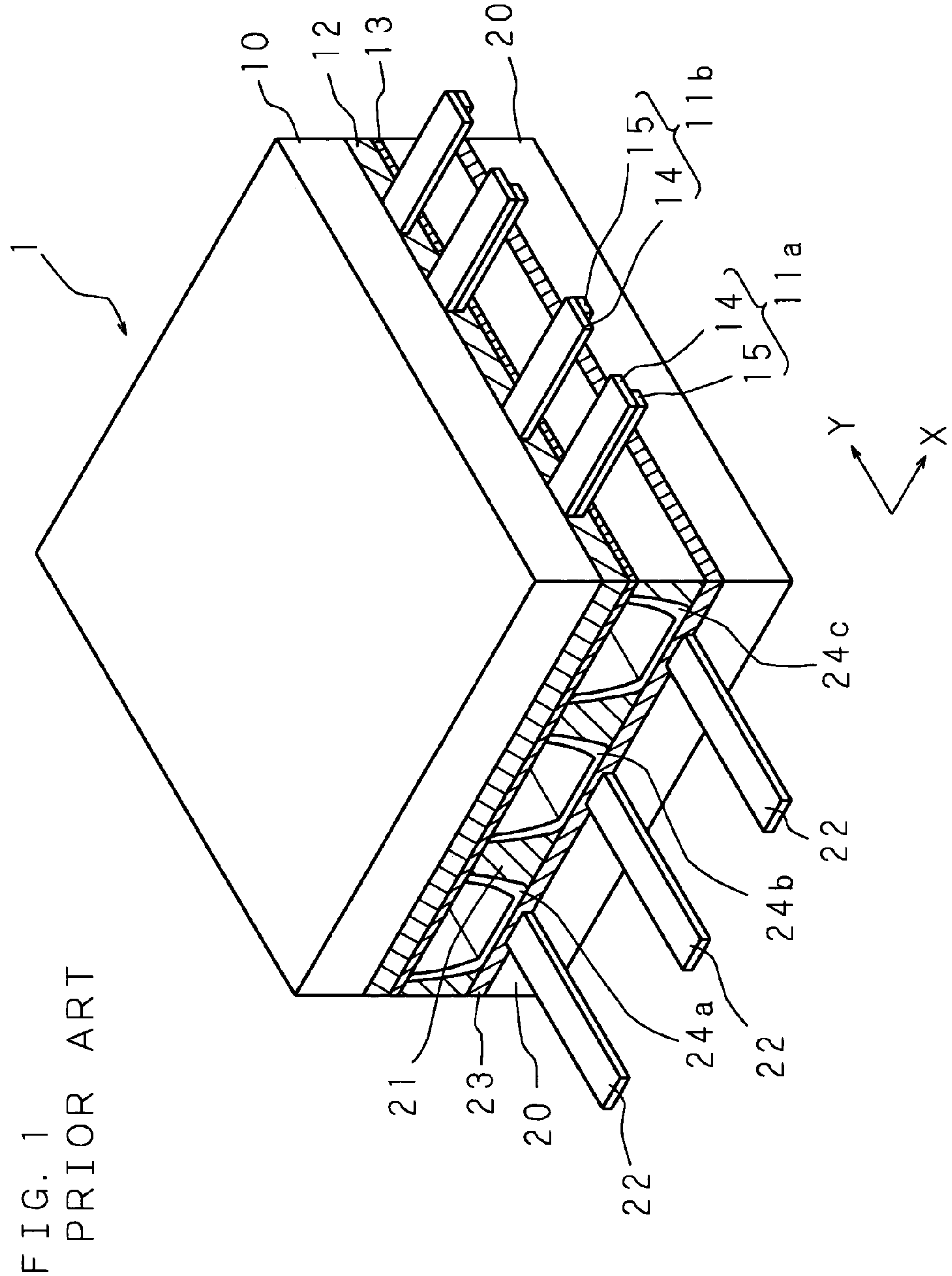
FIG. 1 PRIOR ART
FIG. 1 is a perspective view of essential parts of a general surface discharge AC PDP.
Figure 2A:
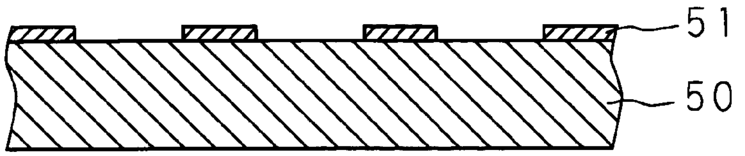
FIGS. 2A–2F are explanatory views showing a method of forming an electrode for a PDP according to Embodiment 1 of the present invention.

FIGS. 2A–2F are explanatory views showing a method of forming an electrode for a PDP according to Embodiment 1 of the present invention. First, a photosensitive resin film 51 such as a dry film resist is attached to a surface of a glass substrate 50, and the attached photosensitive resin film 51 is formed in a desired mask pattern by a photolithography technique (FIG. 2A). The photosensitive resin film 51 has a sandblast resistance against a later-described abrasive material 52. Either negative-type or positive-type film is used as the photosensitive resin film 51 if the mask pattern remaining on the photosensitive resin film 51 makes a partition wall formation region as to be described later. Note that it may also be possible to attach a photosensitive resin film with a desired mask pattern in advance directly to the glass substrate.

Figure 2B:
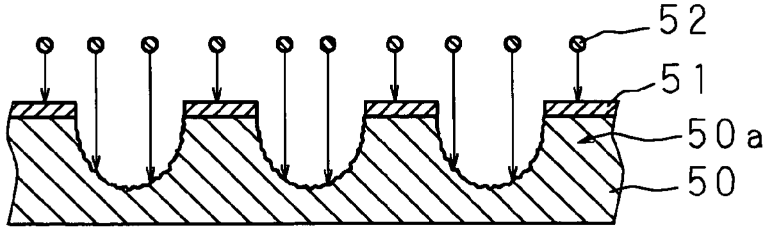
Figure 2C:
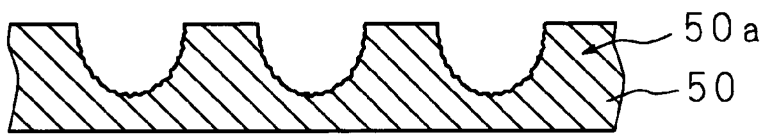

Next, by spraying (sandblasting) the abrasive material 52 such as SiC and alumina with higher hardness than the glass substrate 50 on the glass substrate 50, the glass substrate 50 in regions other than the mask pattern is cut off and partition walls 50*a* are formed (FIG. 2B). Note that the abrasive material 52 may be suitably selected according to the width and pitch of the partition wall 50*a* or the depth of the cut, and, for example, if the depth of the cut is substantially 150 to 200 μm, it is preferable to use a #600 abrasive material (particle diameter: substantially 20 μm) or so.

Figure 2D:
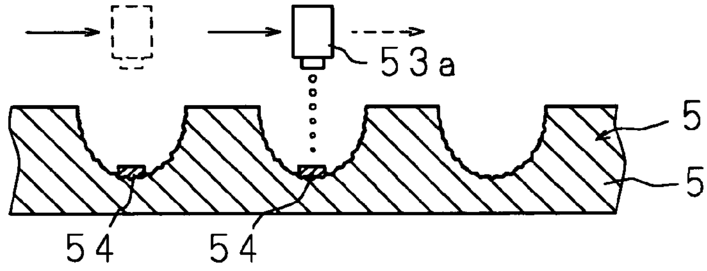

After removing the photosensitive resin film 51 used as the mask from the glass substrate 50 (FIG. 2C), patterning is performed by discharging a reducing agent 54 to the bottom face of the glass substrate 50 (discharge cell surface) between the partition walls 50*a* and 50*a*, that is, a desired region where the electrode is to be formed, by an ink-jet method using an ink-jet head 53*a* (FIG. 2D). As the reducing agent 54, it is possible to use generally available reducing agents containing inorganic tin salts (for example, "MC-SD" available from World Metal, Co., Ltd.). Moreover, since the reducing agent 54 just needs to perform the function of reducing and depositing a later-described plating catalytic metal 56, the reducing agent 54 is formed as a thin line at substantially the center between the partition walls 50*a* and 50*a*, for example. Accordingly, the cross sectional configuration of the glass substrate 50 hardly affects the resulting shape of the reducing agent 54, and the reducing agent 54 can be patterned in a desired shape. It may, of course, be possible to improve the printing performance during patterning by adjusting the viscosity of the reducing agent 54 by suitably mixing additives such as alcohols and polymer resins.

Figure 2E:
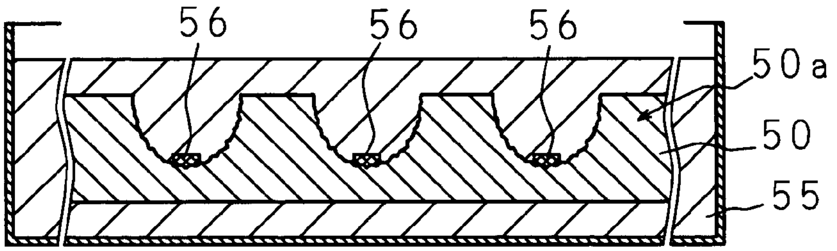

Then, after fixing the reducing agent 54 to the glass substrate 50, by immersing the entire substrate into a plating solution 55, the plating catalytic metal 56 contained in the plating solution 55 is reduced and deposited in the region where the reducing agent 54 is fixed (FIG. 2E). As the plating solution 55, it is possible to use generally available plating solutions containing inorganic palladium salts (for example, "MC-A" available from World Metal Co., Ltd.). As the plating catalytic metal 56, it is possible to use metals such as Au and Ag as well as palladium. Since this reduction reaction occurs only in a region where the reducing agent 54 is present, the plating catalytic metal 56 is reduced and deposited only at substantially the center between the partition walls 50*a* and 50*a*. In other words, since the reducing agent 54 can be patterned in a desired region and in a desired shape as described above, it is possible to reduce and deposit the plating catalytic metal 56 in a desired region and in a desired shape.

Figure 2F:
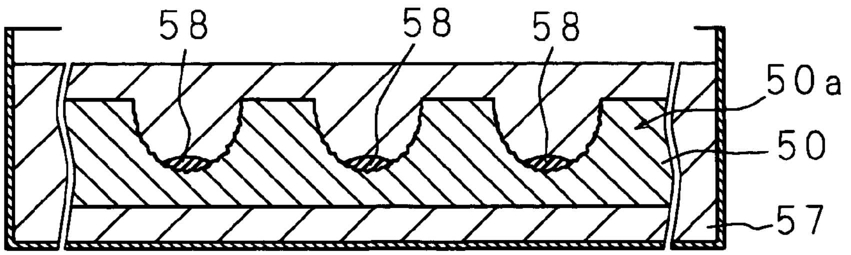

Next, by immersing the entire substrate into an electroless plating solution 57, a metal 58 is deposited by electroless plating in the region where the plating catalytic metal 56 is deposited (FIG. 2F). Since the metal 58 is deposited in the region where the plating catalytic metal 56 is deposited, the shape of the electrode that is the metal 58 depends on the shape of the plating catalytic metal 56, but, since the plating catalytic metal 56 is deposited in a desired region and in a desired shape as mentioned above, it is consequently possible to reduce the variation in electrodes (metal 58). Note that the electroless plating solution 57 may be suitably selected according to a desired metal 58 to be deposited, and, for example, in order to deposit Ni, it is possible to use "Top Chemical Alloy B-1" available from Okuno Chemical Industries, Co., Ltd. Moreover, as the metal 58, it is, of course, possible to use metals such as Co and Cu as well as Ni. In addition, it is possible to reduce the resistance of the electrode (metal 58) by further depositing the metal 58 by electroplating by supplying a current to the metal 58 deposited by electroless plating, if necessary. It may, of course, be possible to deposit, by electroplating, a metal different from the metal 58 deposited by electroless plating.

In the above-described method, since the reducing agent 54 just needs to have the function of reducing and depositing the plating catalytic metal 56, it is sufficient to use a very small amount of the reducing agent 54 for patterning, and therefore the amount of the material can be reduced significantly. Moreover, by immersing the entire substrate into the electroless plating solution 57, it is possible to deposit and form all electrodes (metal 58) at one time, and consequently it is possible to achieve mass production even with inexpensive facilities and it is possible to significantly reduce the tact time required for electrode formation.

Further, since the surface on which the electrodes are formed is made rough by sandblasting, the contact area between the electrode (metal 58) and the glass substrate 50 increases, and the adhesion to the glass substrate 50 is improved. Accordingly, it is possible to reduce occurrence of separation defects of electrodes compared to the case where plated electrodes are formed on a flat glass substrate, that is, a glass substrate on which partition walls are not formed.

The following description will explain other embodiments of the method of forming an electrode for a PDP according to the present invention. In the following embodiments, since the partition walls are formed on a glass substrate in the same manner as in Embodiment 1 (FIG. 2A and FIG. 2B), the explanation of the partition wall formation step is omitted, and only the steps after the formation of the partition walls will be explained.

(Embodiment 2)

Embodiment 1 explains one example in which, after fixing the reducing agent between the partition walls of the glass substrate, the plating catalytic metal is reduced and deposited by immersing the entire substrate into the plating solution, but it may also be possible to discharge the plating solution by an ink-jet method only into the region where the reducing agent is fixed, and Embodiment 2 shows such an example.

Figure 3A:
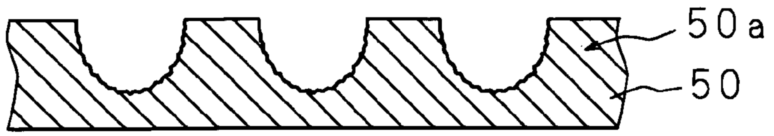
FIGS. 3A–3D are explanatory views showing a method of forming an electrode for a PDP according to Embodiment 2 of the present invention.
Figure 3B:
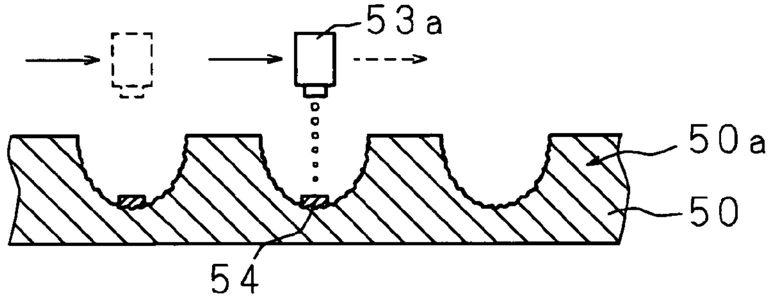

FIGS. 3A–3D are explanatory views showing a method of forming an electrode for a PDP according to Embodiment 2 of the present invention. First, after forming partition walls 50*a* on a glass substrate 50 by sandblasting (FIG. 3A), a reducing agent 54 is discharged in the form of a thin line into a desired region of a discharge cell surface where an electrode is to be formed, for example, substantially the center between the partition walls 50*a* and 50*a*, by an ink-jet method using an ink-jet head 53*a* (FIG. 3B).

Figure 3C:
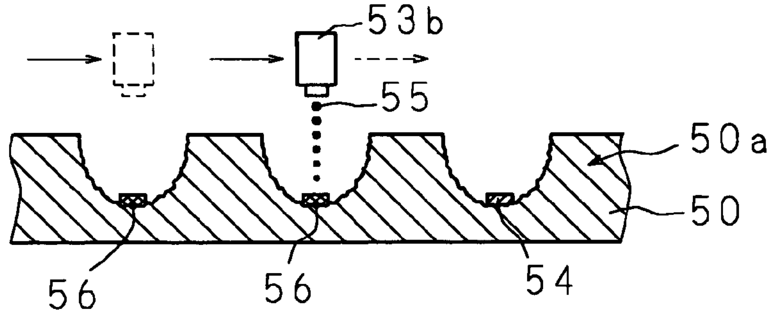

Next, after fixing the reducing agent 54 to the glass substrate 50, a plating solution 55 is discharged to cover the fixed reducing agent 54 by using an ink-jet head 53*b* different from that used for discharging and forming the reducing agent 54, so that a plating catalytic metal 56 contained in the plating solution 55 is reduced and deposited in the region where the reducing agent 54 is patterned (FIG. 3C). Since the plating solution 55 is discharged to cover the reducing agent 54 fixed to the glass substrate 50, it is possible to reduce and deposit the plating catalytic metal 56 in a desired region of the glass substrate 50 and in a desired shape in the same manner as in Embodiment 1.

Figure 3D:
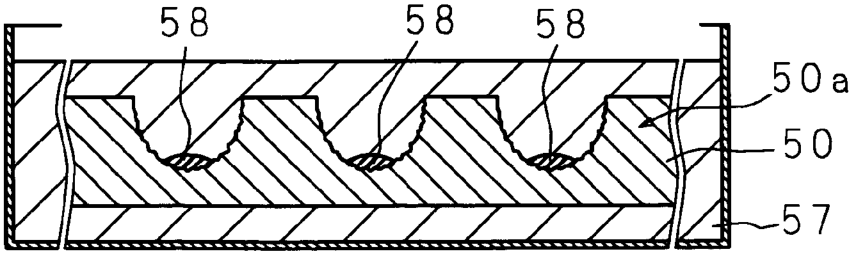

Then, by immersing the entire substrate into an electroless plating solution 57, a metal 58 is deposited by electroless plating in the region where the plating catalytic metal 56 is deposited (FIG. 3D). It may, of course, be possible to reduce the resistance of the electrode (metal 58) by further depositing the metal 58 by electroplating by supplying a current to the metal 58 deposited by electroless plating, if necessary. It may, of course, be possible to deposit, by electroplating, a metal different from the metal 58 deposited by electroless plating.

In the above-described method, in addition to the function and effect of Embodiment 1, since the plating solution 55 is discharged (drawn) only in a desired region of the glass substrate 50, the amount of the material can be reduced significantly. Moreover, since the reduction reaction of the plating catalytic metal 56 occurs only in a region where both the reducing agent 54 and plating solution 55 are present, the plating catalytic metal 56 is reduced and deposited only at substantially the center between the partition walls 50*a* and 50*a*. In other words, in this embodiment, since both of the reducing agent 54 and the plating solution 55 are formed only at substantially the center between the partition walls 50*a* and 50*a*, there is no possibility that the plating catalytic metal 56 is reduced and deposited in regions other than substantially the center between the partition walls 50*a* and 50*a*, thereby enabling more accurate patterning.

Note that although this embodiment uses the ink-jet method to discharge the reducing agent and plating solution, it is also possible to use methods other than the ink-jet method, such as a micro-shot dispenser method, if they are methods capable of discharging an appropriate amount.

Embodiments 1 and 2 explain one example in which the plating catalytic metal is reduced and deposited after fixing the reducing agent between the partition walls of the substrate, but it may also be possible to directly form the plating catalytic metal in a desired region of the substrate, and Embodiment 3 and 4 show such examples. In these examples, since the step of patterning the reducing agent can be omitted, it is possible to significantly reduce the tact time required for electrode formation.

(Embodiment 3)

Figure 4A:
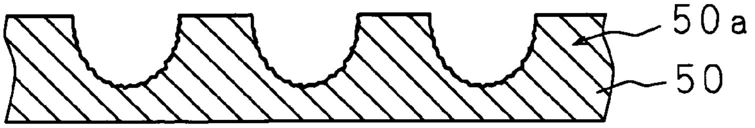
FIGS. 4A–4C are explanatory views showing a method of forming an electrode for a PDP according to Embodiment 3 of the present invention.
Figure 4B:
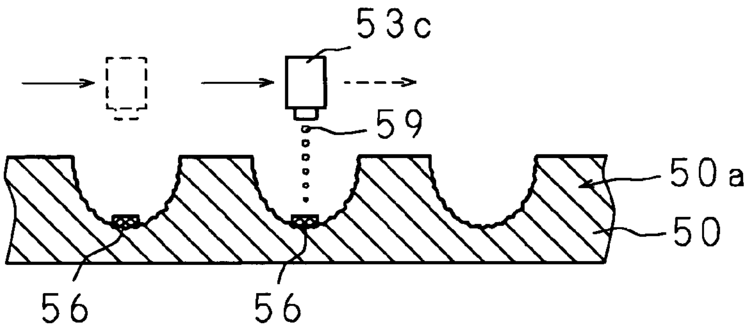
Figure 4C:
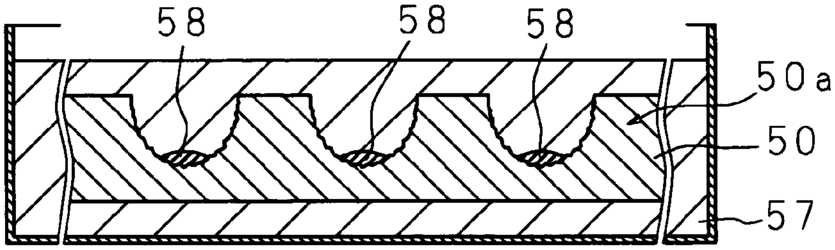

FIGS. 4A–4C are explanatory views showing a method of forming an electrode for a PDP according to Embodiment 3 of the present invention. First, after forming partition walls 50*a* on a glass substrate 50 by sandblasting (FIG. 4A), a plating catalytic metal 56 is formed on the glass substrate 50 by discharging a dispersion solution 59 in which ultra fine particles of a plating catalytic metal (for example, Pb) are dispersed into a desired region of a discharge cell surface where an electrode is to be formed by an ink-jet method using an ink-jet head 53*c* (FIG. 4B). Note that, since a solvent that is mutually soluble in the dispersion solution 59 (for example, theopineol and xylene) can be mixed in the dispersion solution 59, the adhesion to the glass substrate 50 may be improved by mixing a fixing agent such as an acryl resin and ethylcellulose resin, if necessary.

Next, by immersing the entire substrate into an electroless plating solution 57, a metal 58 is deposited by electroless plating in the region where the plating catalytic metal 56 is formed (FIG. 4C). It may, of course, be possible to reduce the resistance of the electrode (metal 58) by further depositing the metal 58 by electroplating by supplying a current to the metal 58 deposited by electroless plating, if necessary. It may, of course, be possible to deposit, by electroplating, a metal different from the metal 58 deposited by electroless plating.

(Embodiment 4)

Figure 5A:
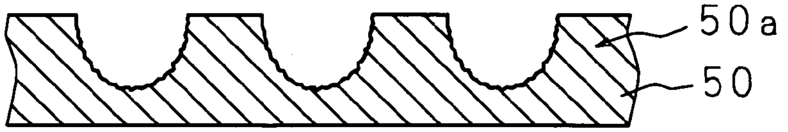
FIGS. 5A–5C are explanatory views showing a method of forming an electrode for a PDP according to Embodiment 4 of the present invention.
Figure 5B:
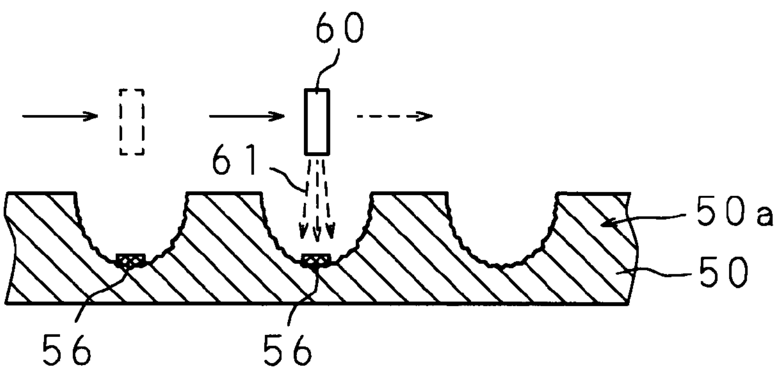
Figure 5C:
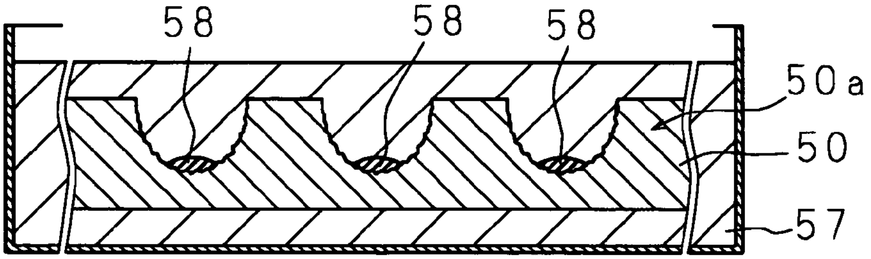

FIGS. 5A–5C are explanatory views showing a method of forming an electrode for a PDP according to Embodiment 4 of the present invention. First, after forming partition walls 50*a* on a glass substrate 50 by sandblasting (FIG. 5A), a plating catalytic metal 56 is formed by vapor deposition on the glass substrate 50 by spraying steam 61 obtained by evaporating a plating catalytic metal (for example, Pb) in vacuum onto a desired region of a discharge cell surface where an electrode is to be formed by means of a nozzle 60 (FIG. 5B).

Then, by immersing the entire substrate into an electroless plating solution 57, a metal 58 is deposited by electroless plating in the region where the plating catalytic metal 56 is formed (FIG. 5C). It may, of course, be possible to reduce the resistance of the electrode (metal 58) by further depositing the metal 58 by electroplating by supplying a current to the metal 58 deposited by electroless plating, if necessary. It may, of course, be possible to deposit, by electroplating, a metal different from the metal 58 deposited by electroless plating.

Note that, in the above-described example, although the partition walls are formed by sandblasting, it may also be possible to form partition walls by etching.

In the present invention, as described above, by forming a metal electrode by fixing a reducing agent for reducing and depositing a plating catalytic metal between partition walls of a substrate having a plurality of partition walls on a surface thereof, reducing and depositing the plating catalytic metal on the fixed reducing agent, and depositing a metal by electroless plating between the partition walls of the substrate on which the plating catalytic metal is reduced and deposited, it is possible to achieve mass production and low cost and also reduce the variation in the shape of electrodes.

Moreover, in the present invention, by forming a metal electrode by directly forming a plating catalytic metal between partition walls of a substrate having a plurality of partition walls on a surface thereof and depositing a metal by electroless plating between the partition walls of a substrate on which the plating catalytic metal is formed, it is possible to achieve mass production and low cost and also reduce the variation in the shape of electrodes.

Further, in the present invention, by supplying a current to the metal deposited between the partition walls and further depositing a metal of the same kind as or different kind from the above metal by electroplating, it is possible to reduce the resistance of electrode and form an electrode having superior conductive characteristics.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. An electrode formation method for a flat display panel for forming a metal electrode between partition walls of a flat display panel substrate having a plurality of partition walls on a surface thereof, comprising the steps of:

discharging a reducing agent for reducing and depositing a plating catalytic metal between the partition walls of the substrate and fixing the reducing agent;

reducing and depositing the plating catalytic metal between the partition walls of the substrate where the reducing agent is fixed; and depositing a metal between the partition walls of the substrate to form a metal electrode by immersing the substrate on which the plating catalytic metal is reduced and deposited into an electroless plating solution.

2. The electrode formation method for a flat display panel of claim 1, wherein the reducing and depositing step comprises the step of immersing the substrate on which the reducing agent is fixed into a plating solution containing the plating catalytic metal.

3. The electrode formation method for a flat display panel of claim 1, wherein the reducing and depositing step comprises the step of discharging a plating solution containing the plating catalytic metal between the partition walls of the substrate where the reducing agent is fixed.

4. The electrode formation method for a flat display panel of claim 1, further comprising the step of further depositing, on a surface of the metal deposited between the partition walls of the substrate, a metal of the same kind as or different kind from said metal by supplying a current to said metal deposited between the partition walls.

5. The electrode formation method for a flat display panel of claim 1, wherein the partition walls are formed by cutting a surface of a glass substrate by sandblasting or etching.

6. An electrode formation method for a plasma display panel for forming a metal electrode between partition walls of a plasma display panel substrate having a plurality of partition walls on a surface thereof for partitioning a discharge space, comprising:

forming the partition walls by cutting a surface of a glass substrate by sandblasting;

discharging a reducing agent for reducing and depositing a plating catalytic metal between the partition walls of the glass substrate and fixing the reducing agent;

reducing and depositing the plating catalytic metal between the partition walls of the glass substrate by immersing the glass substrate where the reducing agent is fixed into a plating solution containing the plating catalytic metal; and depositing a metal between the partition walls of the glass substrate to form a metal electrode by immersing the glass substrate on which the plating catalytic metal is reduced and deposited into an electroless plating solution.

* * * * *